United States Patent [19]

Bateman

[11] Patent Number: 5,535,166
[45] Date of Patent: Jul. 9, 1996

[54] CIRCUIT FOR ISOLATING AND DRIVING INTERCONNECT LINES

[75] Inventor: Bruce L. Bateman, Danville, Calif.

[73] Assignee: MicroUnity Systems Engineering, Inc., Sunnyvale, Calif.

[21] Appl. No.: 280,350

[22] Filed: Jul. 25, 1994

[51] Int. Cl.$^6$ ........................................... G11C 7/02
[52] U.S. Cl. ............................... 365/208; 365/190
[58] Field of Search ............................ 365/208, 207, 365/190, 195, 177; 327/51, 34, 52

[56] References Cited

U.S. PATENT DOCUMENTS

| 5,029,138 | 7/1991 | Iwashita | 365/185 |
| 5,132,576 | 7/1992 | Park | 307/530 |
| 5,315,556 | 5/1994 | Fukushi | 365/208 |
| 5,317,218 | 5/1994 | Liu | 365/207 |

FOREIGN PATENT DOCUMENTS

| 0260474A1 | 3/1988 | European Pat. Off. . |
| 0418794A2 | 3/1991 | European Pat. Off. . |
| 6103748 | 4/1994 | Japan . |
| 2270598A | 3/1994 | United Kingdom . |

OTHER PUBLICATIONS

"BiCMOS Technology and Applications" by Antonio R. Alverez, Kluwer Academic Publishers, pp. 144–149, 229–232.

Primary Examiner—A. Zarabian
Attorney, Agent, or Firm—Burns, Doane, Swecker & Mathis

[57] ABSTRACT

A circuit for isolating an interconnect line from unwanted input signal voltage levels is described. One implementation of the circuit includes a transmission gate coupled in series between an input signal and an interconnect line having its gate coupled to the output of an inverter and the input of the inverter coupled to the input signal. The inverter senses the input signal and when it sense voltages that are either too high or low, the isolation circuit decouples the input signal from the interconnect line such that the input signal can transition independently with respect to the voltage levels on the interconnect line.

23 Claims, 5 Drawing Sheets

CIRCUIT FOR ISOLATING AND DRIVING INTERCONNECT LINES

FIELD OF THE INVENTION

The present invention relates to the field of digital circuits, and particularly to a voltage protection circuit within a digital circuit.

BACKGROUND OF THE INVENTION

Bipolar complementary metal oxide silicon (BiCMOS) technology combines bipolar and CMOS devices in a single integrated circuit. A BiCMOS digital circuit is made up of both bipolar and CMOS type logic gates. As a result, BiCMOS digital circuits tend to have more than one type of digital signal. For instance, a CMOS logic gate typically generates a digital signal having a relatively large peak-to-peak voltage (Vp-p) equaling approximately the difference between the most positive power supply (VDD) and the most negative power supply (VSS). In general, VDD is equal to 5.00 volts and VSS is equal to 0.00 volts in a typical CMOS circuit. On the other hand, a bipolar logic gate, such as an emitter couple logic (ECL) gate, typically generates a digital signal having a Vp-p equal in the hundreds of milivolt range. In comparing the two signals it can be seen that the DC voltage levels that represent the logic high and low states ($V_{HIGH}$ and $V_{LOW}$) for each of the CMOS and ECL logic gates will be different.

Another factor that determines the $V_{HIGH}$ and $V_{LOW}$ for a particular signal is the DC bias voltage of that signal. The DC bias voltage ($V_{DC}$ bias) of a digital signal is the voltage which the digital signal transitions about. FIGS. 1A and 1B illustrate two digital signals having the same Vp-p but being biased about different bias voltages. Digital signal 10 (FIG. 1A) has a Vp-p equal to VDD and a $V_{DC}$ bias equal to 0.00 volts. As a result, $V_{HIGH}$ is equal to VDD/2 and $V_{LOW}$ is equal to −VDD/2 for signal 10. On the other hand, signal 20 (FIG. 1B) has the same Vp-p as signal 10, but, its VDC bias is equal to VDD/2 instead of 0.00 volts. Consequently, $V_{HIGH}$ for signal 20 is equal to VDD and $V_{LOW}$ is equal to 0.00 volts.

Since BiCMOS digital circuits have digital signals generated from both bipolar logic gates and CMOS logic gates, a single BiCMOS digital circuit may have several types of digital signals having various peak-to-peak voltages and DC bias voltages. As a result, digital interconnect lines within a BiCMOS digital circuit may be subjected to a large range of voltage levels. Consequently, a situation that frequently occurs in a BiCMOS digital circuit is that the base of a given NPN bipolar transistor is coupled to an interconnect line that is transitioning between a large range of voltage levels. In the case in which the emitter of that particular transistor is tied to a fixed voltage, the base voltage can become significantly more negative than the voltage on the emitter. When this occurs, the base-emitter junction becomes strongly reverse biased. It is well known in the art, that repeated reverse biasing of a bipolar transistor's emitter-base junction can cause junction degradation and can eventually lead to poor circuit performance or failure.

One particular instance in which this reverse bias condition is prevalent is during a write operation in a memory array. FIG. 2 illustrates a block diagram of a column in a typical static random access memory (SRAM) array along with some peripheral read/write logic. The column of memory cells includes two memory cells (C1, C2). Each cell functions to store a bit of data and the inverse of that data. Each of the cells are coupled to a bit line (BL) and the inverse of the bit line (BL/). Similarly, each of the cells is coupled to a memory cell select line and write line such that only one cell may be selected or written into at a time. BL and BL/are also coupled to a sense amplifier and a word line driver.

The sense amplifier includes two emitter coupled transistors, Q1 and Q2, each having their base coupled to BL and BL/, respectively. The sense amplifiers also include a resistive load, R, coupled between each of the collectors of the transistors and VDD and a current source coupled between the emitters of the transistors and VSS. The write driver includes two CMOS inverters, INV1 and INV2.

The typical prior art operation of the SRAM shown in FIG. 2 is that during a read operation, both of the CMOS inverter write drivers, INV1 and INV2, are "off". That is, a voltage corresponding to a low logic state is applied to the input of each inverter and the output of each inverter is at a voltage corresponding to a high logic state. Generally, the voltage level corresponding to a CMOS inverter high logic state is equal the most positive power supply in the circuit (referred to as VDD). Further, the voltage level corresponding to a CMOS inverter low logic state is equal to the most negative power supply of the circuit (referred to as VSS). Typically, VDD is equal to 5.00 volts and VSS is equal to 0.00 volts. Thus, during a read operation, the write drivers are pulling both BL and BL/to a voltage equal to VDD. Also during a read operation, one of the memory select lines is selected and the data stored in the accessed memory cell is passed to each of BL and BL/such that the memory cell drives one bitline "low" and the other "high". In doing this, the memory cell attempts to pull either BL or BL/towards VSS, (depending on the data stored in the memory cell). However, the write drivers are designed to be much stronger than the memory cell. As a result, the voltage on the "low" bitline is held clamped at a voltage slightly lower than VDD (typically around 200.00 milivolts below VDD) while the high bitline is driven to VDD. Thus, during a read operation for the SRAM shown in FIG. 2, BL and BL/transition between a voltage equal to VDD (a "high" logic state) and at a voltage slightly less than VDD (a "low" logic state).

During a write operation in the SRAM array shown in FIG. 2, one of the CMOS inverters are enabled and one is disabled—depending on the data to be written into the cell. As a result, one of the bitline pairs is driven to a CMOS high logic level (VDD) and the other is driven to a CMOS low logic level (VSS). By driving BL and BL/to these voltages the write driver is able to change the state of the memory cell. However, in driving one of the bitlines to VSS, an undesirable condition occurs. Specifically, if one of the bitlines, for example BL, is at a voltage equal to VSS and the other, BL/, is at a voltage equal to VDD, then the voltage applied to the base of Q1 is equal to VSS and the voltage applied to the base of Q2 is equal to VDD. In this state, the emitters of both sense amplifier bipolar transistors are at a voltage equal to one diode drop less than VDD (i.e. VDD−$V_{BE}$). With VSS applied to its base and VDD−$V_{BE}$ applied to its emitter, the base-emitter junction of Q1 is strongly reversed biased.

One manner in which circuit designers presently avoid this reverse bias condition, whether in an SRAM circuit or in any general circuit design, is to avoid using a combination of small swing/large swing signals on the base of any bipolar transistors within the design. Designing a circuit in this way eliminates any chance of base-emitter junctions becoming strongly reverse biased. However, this technique can be very limiting in BiCMOS circuit designs.

One generally known method utilized to avoid subjecting certain interconnect lines to undesirable variable voltage level signals is to isolate or decouple the interconnect line from the source of the signal. FIG. 3 illustrates a typical prior art isolation circuit. The isolation circuit shown in FIG. 3 includes decode logic 40 and transmission gates (T1–T4) coupled between the variable voltage signal 41 and each of the interconnect lines, I1–I4. Control signal 42 (generated from another portion of the logic circuit) designates which interconnect line is to be decoupled. Typically, the control signal corresponds to specific operations or synchronized events occurring within the circuit in which particular interconnect lines need to be decoupled. Decode logic 40 decodes the control signal and couples a disable signal on the control terminal of the corresponding transmission gate of the designated interconnect line. The main disadvantage of this type of isolation circuit—particularly in large scale integrated (LSI) circuit designs—is that the decode circuitry is typically implemented with numerous gates. As a result, decode logic 40 can potentially add many gate delays to the integrated circuit while consuming large amounts of chip space. In addition, more logic may be required to generate the control signal.

The present invention is a protection circuit that automatically senses when a variable voltage level signal coupled to an interconnect line has reached an undesirable DC voltage level and then isolates the interconnect line from the voltage. The advantage of the present invention is that it responds to the specific voltage level on the interconnect line and not to other event controlled signals originating within the logic circuit as with the prior art. Thus, the present invention is a self-contained isolation circuit, that requires no additional logic. In addition, the level sensing feature of the present invention allows circuit designers to isolate interconnect lines from different voltages. For example, while one line may be isolated from one particular voltage level, another may be isolated from another voltage level. Finally, since the present invention does not require decode circuitry, such as the prior art, it is more space efficient and tends to have less gate delays.

SUMMARY OF THE INVENTION

A protection circuit that senses the DC voltage level of a variable voltage level signal on an interconnect line and isolates that line from voltages greater than or less than a previously selected DC voltage level is disclosed. The protection circuit is particularly useful in isolating base-emitter junctions in BiCMOS circuits so that they do not become strongly reverse biased.

The first embodiment of the present invention is designed to protect interconnect lines from voltages that are too negative. This embodiment includes a p-channel metal-oxide-silicon field effect transistor (MOSFET) transmission gate and an inverter. The transmission gate's input terminal and the input of an inverter is are coupled to the variable voltage level signal. The control terminal of the transmission gate is coupled to the output of the inverter and the output terminal of the transmission gate is coupled to the particular interconnect line to be protected.

The protection circuit functions such that when the variable voltage level signal is above a certain voltage, the inverters output is low and the MOSFET transmission gate is conducting. As a result, the variable voltage signal is coupled to the interconnect line. However, when the input signal is below a given voltage level (i.e. the trip point of the inverter), the output of the inverter is high and the MOSFET transmission gate is disabled. When this occurs, the interconnect line is decoupled from the variable voltage signal.

Another embodiment of the present invention is designed to protect interconnect lines from voltages that are too positive. This embodiment includes an n-channel metal-oxide-silicon field effect transistor (MOSFET) transmission gate and an inverter. The transmission gate's input terminal and the input of the inverter are coupled to the variable voltage signal. The control terminal of the transmission gate is coupled to the output of the inverter and the output terminal of the transmission gate is coupled to the particular interconnect line to be protected.

The third embodiment of the present invention utilizes a level comparator instead of an inverter thereby making it possible to precisely set the level at which the transmission gate is enabled. In this way, the interconnect line is protected from a specified voltage level set by a level comparator, instead of by the trip point voltage of the inverter.

Finally, the fourth embodiment is designed so that when a particular interconnect line is decoupled from the variable voltage level signal, the interconnect line can be set to an different voltage instead of being left to float. This fourth embodiment includes an MOS device voltage divider network coupled to the interconnect line in addition to the transmission gate and inverter connected as described above. The voltage divider network is responsive to the isolation circuit such that when the interconnect line is isolated, the voltage divider network sets the interconnect line to a previously specified voltage.

In a fifth embodiment of the present invention, the fourth embodiment is implemented in such a way so as to protect the base-emitter junction of emitter coupled bipolar transistors in sense amplifiers within memory devices.

DETAILED DESCRIPTION

A voltage protection circuit is described. In the following description, numerous specific details are set forth, such as device type, digital voltage levels, etc., in order to provide a thorough understanding of the present invention. It will be obvious, however, to one skilled in the art that these specific details need not be employed to practice the present invention. In other instances, well-known ECL and CMOS gates have not been described in detail in order to avoid unnecessarily obscuring the present invention.

Figure 4:
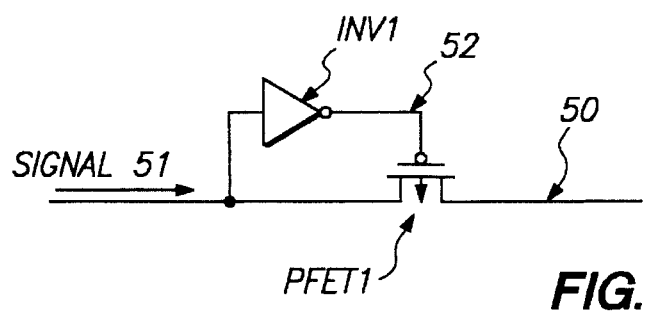
FIG. 4 illustrates the embodiment of the present invention that isolates interconnect lines from voltages that are too negative.

The embodiment of the present invention shown in FIG. 4 isolates interconnect line 50 from voltages less than the trip point of INV1. Referring to FIG. 4, p-channel MOSFET device, PFET1, is coupled as a transmission gate between the variable voltage level signal 51 and interconnect line 50. Signal 51 is coupled to the input terminal of PFET1 and the input of INV1. The output terminal of PFET1 is coupled to interconnect line 50. The PFET transmission gate functions in the typical manner wherein when its control terminal (line 52) is at a low voltage corresponding to a logical low state, it is enabled and signal 51 is transmitted through to interconnect line 50. When PFET 1's control gate is at a high voltage corresponding to a logical high state, it is disabled and signal 51 is isolated from interconnect line 50.

INV1 functions to enable or disable transmission gate PFET 1. INV1's output is coupled to the control terminal of PFET1, line 52. INV1's trip point is set to the voltage at which the transmission gate is to be disabled. For instance, if interconnect line 50 needs to be isolated from voltages less than 3 volts, then the trip point of INV1 is set to 3 volts.

When signal 51 is transitioning above the trip point of the inverter, the output of INV1 is low, causing PFET1 to be enabled. As a result, signal 51 is transmitted through to interconnect 50. When signal 51 transitions below the trip point of INV1, the output of the inverter goes high, disabling PFET1. In this state, signal 51 is isolated from interconnect line 50 and line 50 is left floating unless it is being driven by some other signal.

Figure 5:
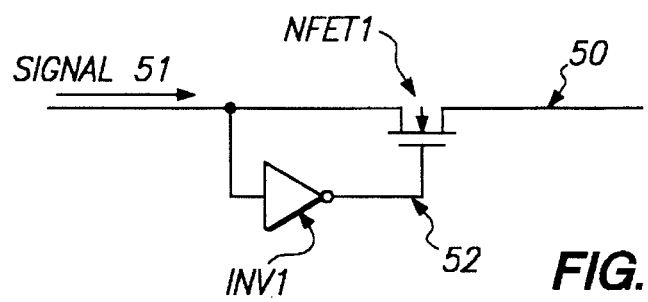
FIG. 5 is another embodiment of the present invention that isolates interconnect lines from voltages that are too positive.

The embodiment shown in FIG. 5 is the same as the embodiment shown in FIG. 4 except that it isolates interconnect line 50 from voltages greater than the trip point voltage of INV1. Referring to FIG. 5, NFET1 has its input terminal coupled to variable voltage level signal 51, its output terminal coupled to interconnect line 50 and its control terminal (line 52) coupled to the output of INV1. The input of INV1 is coupled to signal 51. When signal 51 is low, i.e. less than the trip point of INV1, INV1 outputs a high voltage and enables NFET1. In this state, signal 51 is transmitted to interconnect line 50. When signal 51 becomes greater than the trip point voltage of INV1, INV1's output transitions low and disables the transmission gate. In this state interconnect line 50 is isolated from signal 51 and is floating.

Figure 6A:
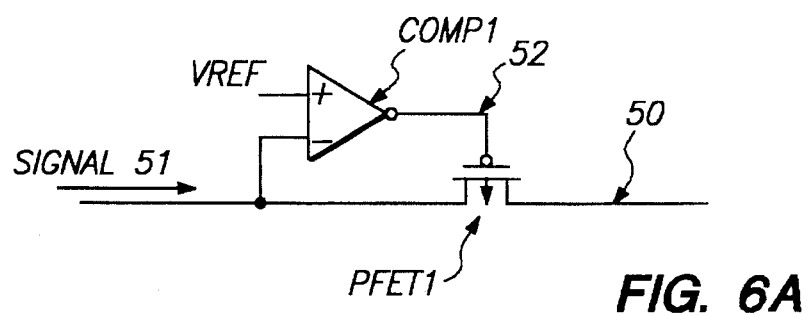
FIG. 6A and 6B are further embodiments of the present invention that isolates interconnect lines from a specific voltage level—the voltage level being precisely set by a comparator.
Figure 6B:
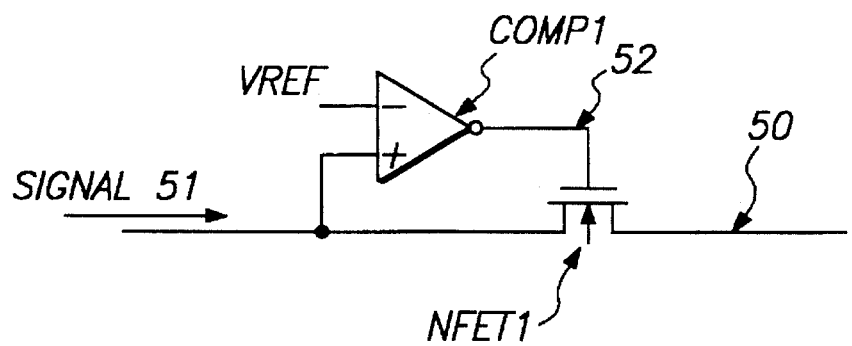

In the embodiments shown in FIGS. 4 and 5, the trip point at which the transmission gate is enabled or disabled is the same as the trip point of the inverter. In general, the trip point of an inverter may vary due to fluctuations in operating conditions. Consequently, the trip point of the inverter may not be an exact voltage. FIGS. 6A and 6B show embodiments of the present invention in which the trip point can be precisely set.

FIG. 6A shows transmission gate PFET1 having its input terminal coupled to signal 51, its output terminal coupled to interconnect line 50 and its control terminal coupled to the output of comparator COMP1. The positive input of COMP1 is coupled to VREF and the negative input of COMP1 is coupled to signal 51. When the voltage on its negative input is greater than VREF, COMP1 outputs a low voltage and enables PFET1 such that signal 51 is transmitted to line 50. In the case in which signal 51 is less than VREF, the output of COMP1 is high, the transmission gate is disabled, and interconnect line 50 is isolated from signal 51.

FIG. 6B illustrates a configuration similar to FIG. 6A. FIG. 6B includes transmission gate NFET1 having its input terminal coupled to signal 51, its output terminal coupled to interconnect line 50 and its control terminal coupled to the output of comparator COMP1. The negative input of COMP1 is coupled to VREF and the positive input of COMP1 is coupled to signal 51. When the voltage on its positive input is less than VREF, COMP1 outputs a high voltage and enables NFET1 such that signal 51 is transmitted to line 50. In the case in which signal 51 is greater than VREF, the output of COMP1 is low, the transmission gate is disabled, and interconnect line 50 is isolated from signal 51.

Figure 7:
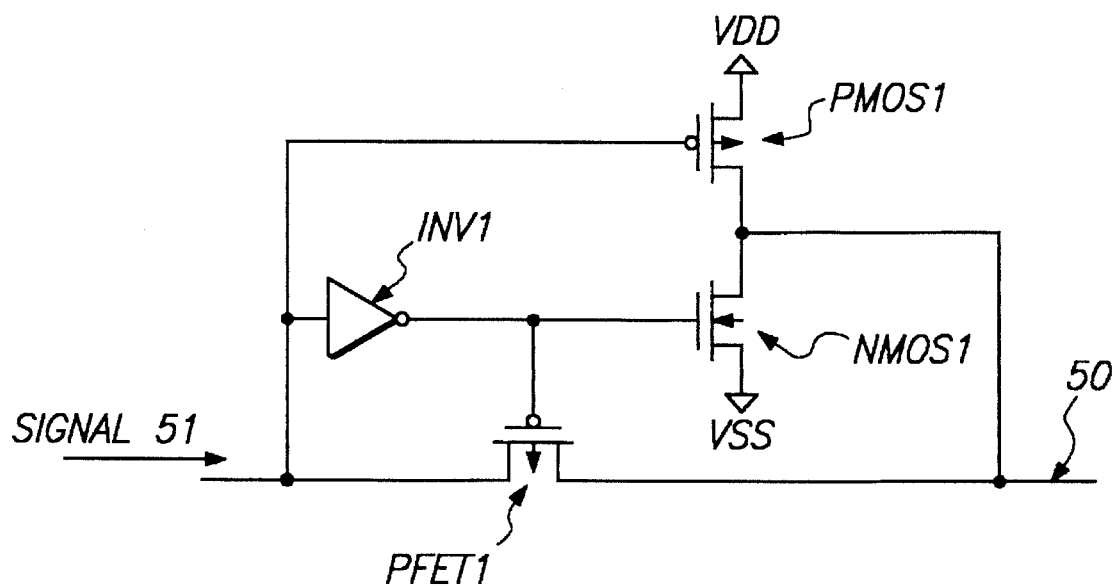
FIG. 7 illustrates the embodiment of the present invention that isolates an interconnect line from voltages that are too negative and drives the interconnect line with a selected voltage once the interconnect line is isolated.

FIG. 7 is an embodiment of the present invention that sets interconnect line 50 to a particular voltage, once it has been isolated from variable voltage level signal 51. Referring to FIG. 7, PFET1's input terminal is coupled to signal 51, its output terminal is coupled to interconnect line 50 and its control terminal is coupled to the output of INV1. The input of INV1 is coupled to signal 51. Also included in FIG. 7 is PMOS1 and NMOS1 coupled in series between VDD and VSS. The source of PMOS1 is coupled to VDD, its gate is coupled to signal 51, and its drain is coupled to the drain of NMOS1. The source of NMOS1 is coupled to VSS and its gate is coupled to the output of INV1. The drains of NMOS1 and PMOS1 are also coupled to interconnect line 50.

When signal 51 is at a voltage greater than the trip point of INV1, the output of INV1 is low and PFET 1 is enabled. In addition, since the output of INV1 is low and signal 51 is high, NMOS1 and PMOS1 are both off. In this state, signal 51 is transmitted to interconnect line 50 and NMOS1 and PMOS1 have no effect on interconnect line 50.

In the case in which signal 51 is less than the trip point of INV1, the output of INV1 is high and PFET1 is off. This isolates interconnect line 50 from signal 51. In addition, since signal 51 is low and the output of INV1 is high, PMOS1 and NMOS1 function as a voltage divider network. Consequently, interconnect line 50 is set to a voltage somewhere between VDD and VSS-determined by the conductance ratio of PMOS1 and NMOS1. This particular embodiment is employed if it is preferable not to leave interconnect line 50 floating after it has been isolated from variable voltage level signal 51.

Figure 8:
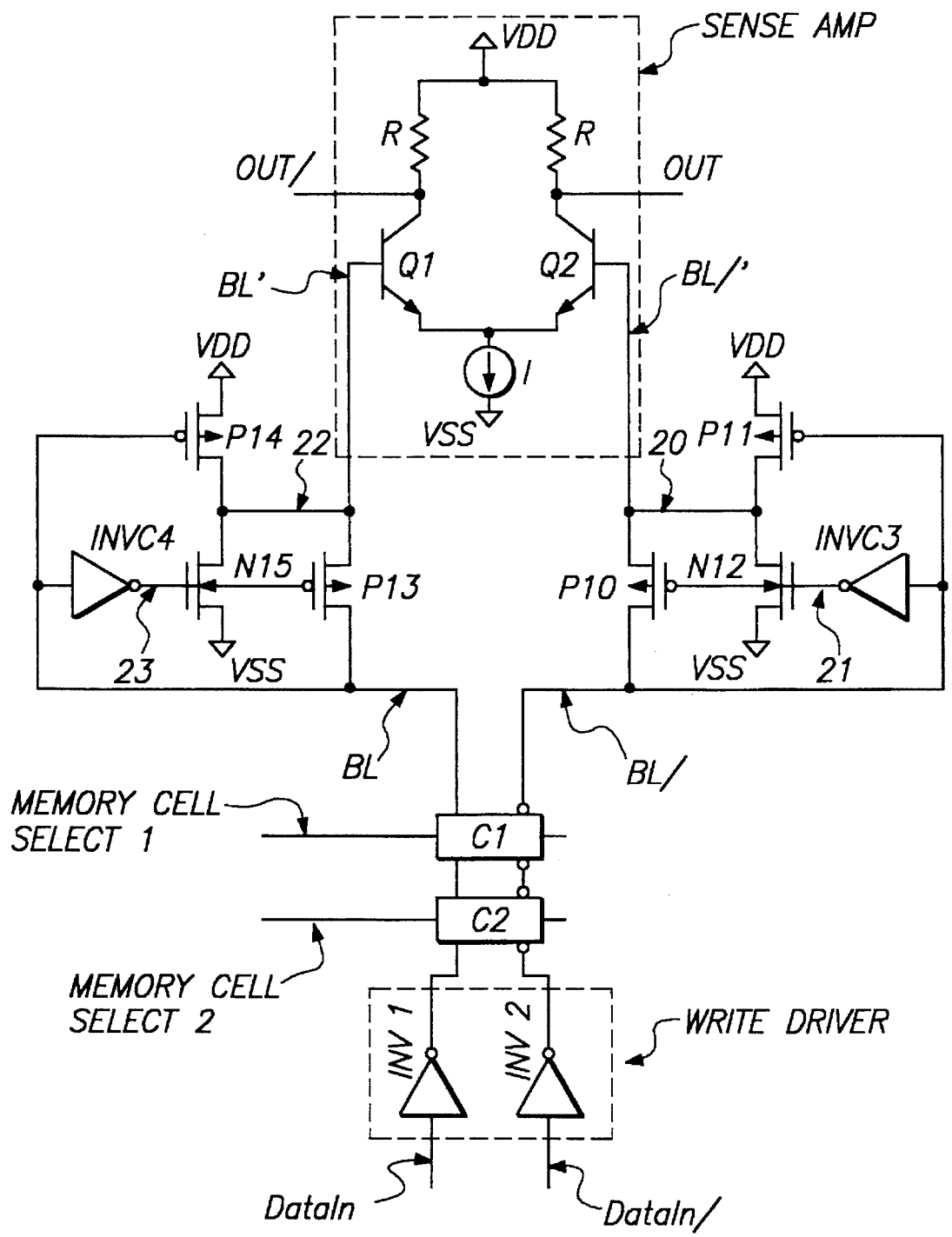
FIG. 8 illustrates the embodiment of the present invention as shown in FIG. 7 as applied to a differential SRAM memory array.

The embodiment of the present invention illustrated in FIG. 7 is shown in FIG. 8 as applied to isolating the base of a bipolar transistor in a sense amplifier in an SRAM circuit. Referring to FIG. 8, the SRAM array shows two memory cells, C1 and C2. C1 and C2 are coupled to a common bitline pair BL and BL/. Each of the cells have separate select lines, memory select lines 1 and 2. The write driver consists of a pair of CMOS inverters, INV1 and INV2, the output of each being coupled to BL and BL/, respectively. The sense amplifier includes two emitter coupled bipolar transistors (Q1 and Q2), a current source (I) coupled between the emitters and VSS, and two resistors each coupled between the collector of each transistor and VDD. The base of Q1 is coupled to BL' and the base of Q2 is coupled to BL/'. The sense amplifier outputs the sensed data signals on lines OUT and OUT/.

FIG. 8 also includes two isolation circuits of the present invention, each having the embodiment as shown in FIG. 7. The first isolation circuit corresponding to BL' comprises PMOS devices P10 and P11, NMOS device N12, and CMOS inverter, INV3. Similarly, the second isolation circuit corresponding to BL' comprises PMOS devices P13 and P14, NMOS device N15, and CMOS inverter INV4.

The SRAM in FIG. 8 functions in the following manner. During a read operation the write driver is turned "off" by coupling a low voltage to both DataIn and DataIn/. With DataIn and DataIn/ low, BL and BL/ are at a voltage level corresponding to a high logic state, i.e. VDD. In addition, during the read operation, the selected memory cell tries to drive one of the bitline pairs to VDD (a high logic level) and one to VSS (a low logic level). However, because the write driver is designed to provide a stronger drive to the bitlines, the actual "low" level voltage during the read operation is only slightly lower (by a few hundred milivolts) than VDD. Thus, during a read operation, BL and BL/ transition between VDD (logic "high") and a voltage slightly lower than VDD (logic "low"). The sense amplifier is designed such that it is able to discern between these voltages so as to sense the correct logic states on BL and BL/ and output corresponding voltage levels on OUT and OUT/, respective Also during the read operation, the voltage levels on BL and BL/ are coupled to the inputs of INV3 and INV4. As a result, the input of one of the inverters is coupled to VDD (logic "high") and the input of the other inverter is coupled to a voltage slightly lower than VDD (logic "low"). The inverter coupled to the logic "high" outputs a logic low state voltage (VSS) as would be expected. However, the inverter having its input coupled to the logic "low" voltage actually interprets it as a high logic state since the logic "low" voltage in the read operation is so close to VDD. As a result, during the read operation, both INV3 and INV4 output a logic low voltage, VSS, onto lines 21 and 23.

In addition, the voltage levels on BL and BL/ during a read operation are higher than the threshold voltage ($VT_p$) of P11 and P14. Consequently, P11 and P14 are off and have no affect on BL and BL/. Further, with the outputs of both INV3 and INV4 low, N12 and N15 are both off and have no affect on BL' and BL/'. Finally, with lines 21 and 23 low, both P10 and P13 are on and pass the data on BL and BL/ to BL' and BL/' respectively. Thus, during a read operation, the memory cell shown in FIG. 8 is unaffected by the isolation circuit of the present invention and data from BL is passed to BL' while data on BL/ is passed to BL/'.

During a write operation, one of the write driver inverters is enabled and the other is disabled such that one of the bitline pairs is at a voltage equal to VDD and the other is at a voltage level equal to VSS. As described above with respect to the prior art SRAM, this condition causes the base-emitter junction of one of the sense amplifier's transistors to become strongly reversed biased. The isolation circuit of the present invention shown in FIG. 8 functions to prevent this from happening in the following manner.

When the voltage on one of the bitlines, for example BL, drops to VSS during a write operation, a voltage corresponding to VSS is also coupled to the input of INV4. As a result, INV4 outputs a high voltage (VDD) on line 23. With line 23 high, the gate of P13 is also high, causing P13 is to be disabled. Consequently, BL is decoupled from BL'; thereby isolating the base of Q1 from the VSS voltage level.

In addition, the high voltage on line 23 is coupled to the gate of N15, causing N15 to be on. Also, since the gate of P14 is coupled to BL, it is also on. Devices P14 and N15 function as a voltage divider network coupled between VDD and VSS. P14 and N15 are biased such that their conductance ratio sets the voltage on line 22 to approximately the same voltage as the logic "low" voltage during a read operation. Thus, BL is decoupled from BL' during a potential reverse bias condition and BL' is set to the logic "low" read voltage (i.e. VDD—approximately 200.00 milivolts). It should be noted that by setting BL' to the logic "low" read voltage during a write operation in addition to having the base of Q2 being coupled to a voltage equal to VDD, (i.e. the logic "high" voltage during a read operation), the sense amplifier is able to read the data as it is being written into the memory cell. Consequently, simultaneous reads and writes may be performed.

The isolation circuit associated with BL/ includes PMOS devices P10 and P11, NMOS device N12, and CMOS inverter INV3. This isolation circuit functions in the same manner as the isolation circuit associated with BL. Specifically, when BL/ is driven to VSS by write driver inverter INV2, the output of INV3 goes high, disabling P10. Consequently, BL/is decoupled from BL/'. Further, with line 21 high (VDD) and BL/ low (VSS), devices P11 and N12 are on. The conductance ratio of P11 and N12 are selected such that the voltage on line 20 is the same as the logic "low" level voltage during a read operation.

Figure 1A:
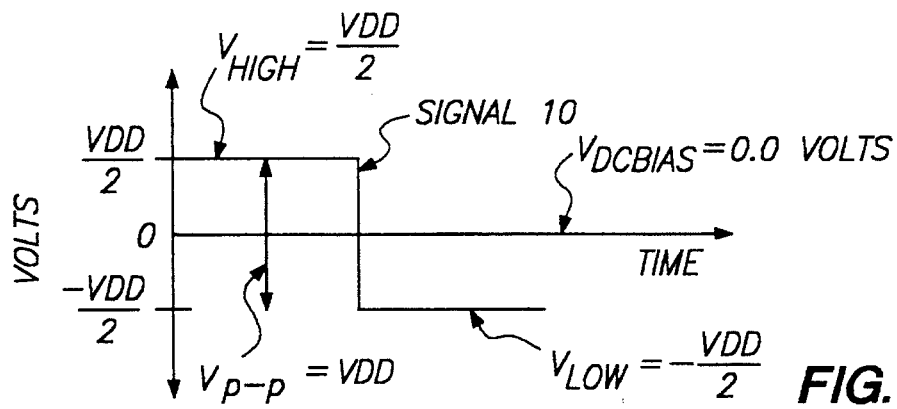
FIGS. 1A and 1B illustrate different digital signals with the same Vp-p voltage and different DC bias voltages.
Figure 1B:
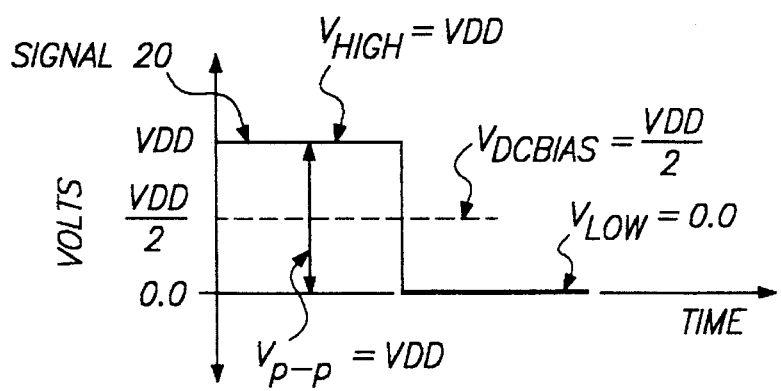
Figure 2:
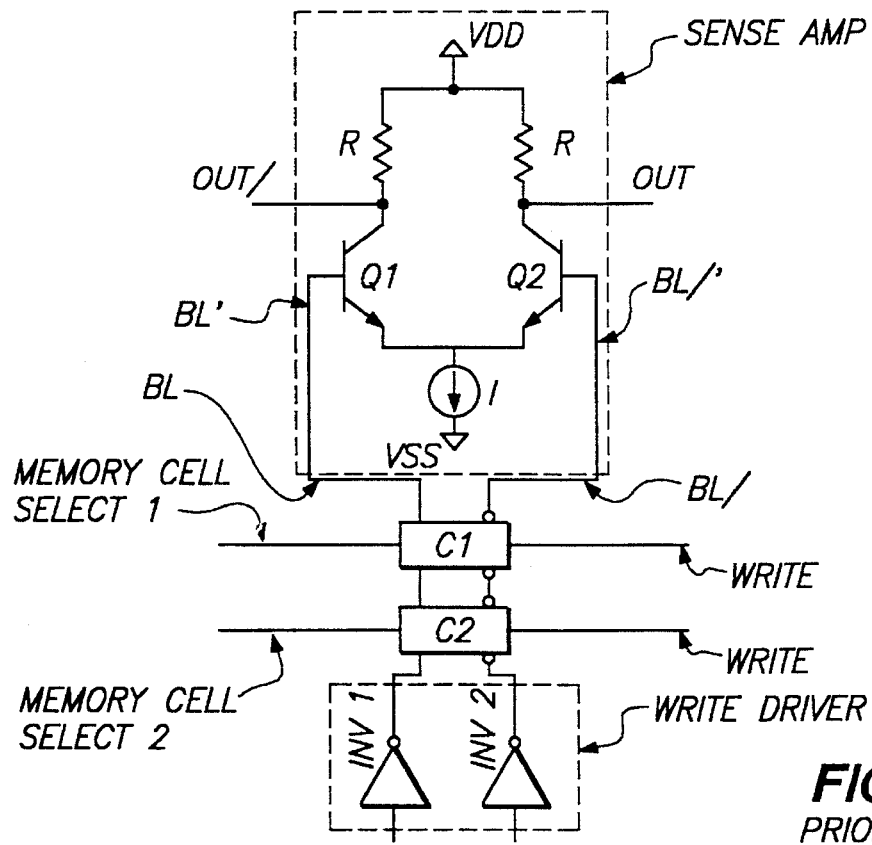
FIG. 2 illustrates a prior art SRAM array.
Figure 3:
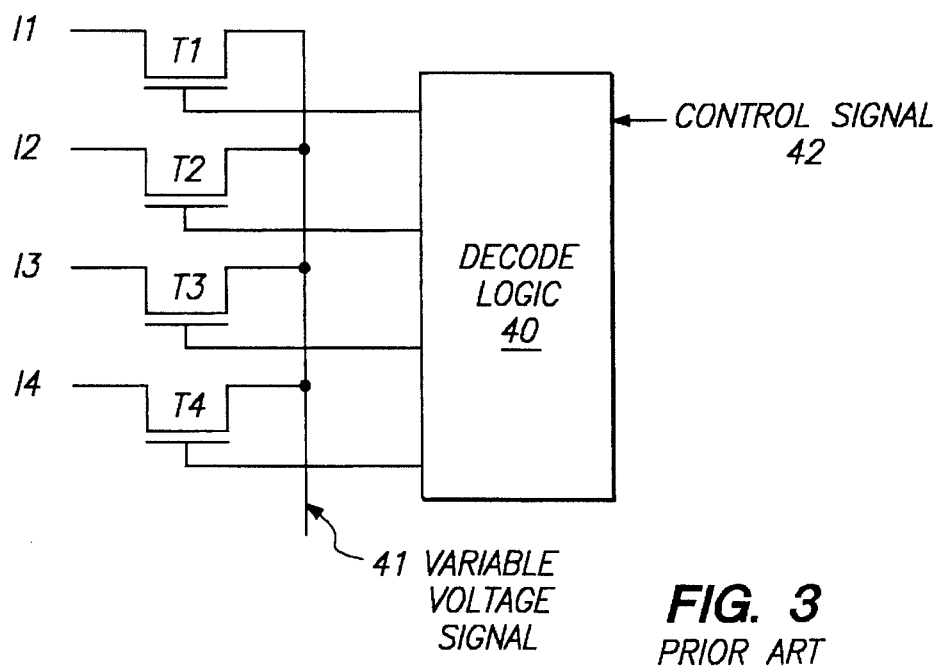
FIG. 3 illustrates a prior art isolation circuit.

Note, that the embodiment of the memory cell of the present invention shown in FIG. 8 is a differential memory cell. A differential memory cell characteristically stores a data bit and the inverse of that data bit. In addition, a differential memory cell has a bit line pair, BL and BL/. Each one of the bit line pair couples a data bit from the memory cell to the base of each one of the sense amplifier's emitter coupled transistors. For example, referring to FIG. 2, BL is coupled to the base of Q1 and BL/is coupled to the base of Q2. Thus, in a differential memory cell each of the base-emitter junctions of the sense amplifier's transistors can potentially become reverse biased. Thus, in the embodiment of the present invention shown in FIG. 8, two protection circuits are required; one to protect each base-emitter junction.

Figure 9:
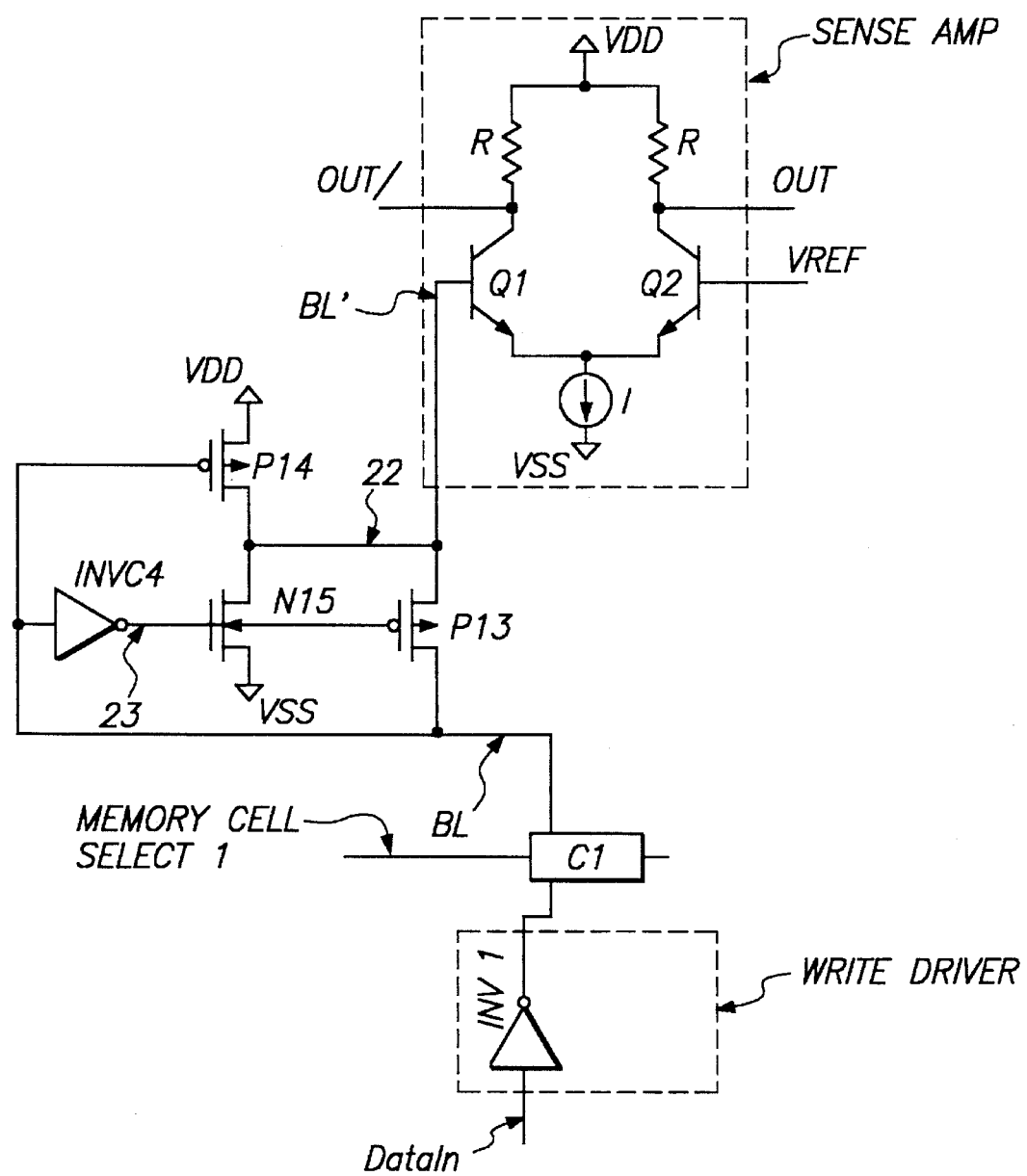
FIG. 9 illustrates an embodiment of the present invention as shown in FIG. 7 as applied to a single-ended SRAM memory array.

Another embodiment of the present invention is a single-ended memory cell configuration. As is well known in the art, a single-ended memory cell only stores a single bit of data and typically has a single bit-line coupled to the base of one of the sense amplifier's emitter coupled transistors. Referring to FIG. 9, memory cell C1 is coupled to single bit-line BL. In order to perform a read or write, memory cell 1 is accessed by selecting the memory cell select 1 line.

The write driver (shown in FIG. 9) (comprising CMOS inverter INV) drives BL with voltages having magnitudes that will change the state of memory cell C1. It should be noted that only a single write driver is needed to program memory cell 1 since only one bit of data is stored in it. The memory cell also includes a sense amplifier having two emitter-coupled transistors Q1 and Q2, two resistors R and a current source I: Q1 has its base coupled to BL' and Q2 has its base coupled to a reference voltage. The sense amplifier functions as a comparator such that if the voltage on BL' is greater than VREF, then OUT is high and OUT/is low. Further when BL' is less than VREF, OUT is low and OUT/is high.

As can be seen in FIG. 9, the single-ended memory cell has only a single bit-line and as such the base-emitter junction of only one of the sense amplifier's emitter coupled pair can potentially become reverse biased. Consequently, only a single protection circuit as described by the present invention is required.

The protection circuit of the present invention shown in FIG. 9 includes P13, P14, N15 and inverter INVC4. As described above in conjunction with FIG. 8, when BL is driven to a CMOS low level, P13 is disabled and isolates BL' from BL. In addition, P14 and N15 are enabled and function as a voltage divider network so as to cause BL' to be driven to a logic "read" low voltage. Conversely, in the case when BL is driven to a voltage greater than the trip point of INV4, P13 is enabled and couples BL to BL', while P14 and N15 are disabled and have no affect on BL'.

Although the elements of the present invention has been described in a conjunction with certain embodiments, it is appreciated that the invention may be implemented in a variety of other ways. For example, although the embodiment of the present invention shown in FIG. 7 protects interconnect lines from voltages that are too negative, they can be easily modified to decouple lines from voltages that are too positive. It should further be noted that although the embodiments shown in FIGS. 8 and 9 are directed towards single and differential SRAMs, the isolation circuit of the present invention can easily be applied to most memory arrays in which base-emitter junction reverse biasing is prevalent. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

We claim:

1. A circuit for isolating an interconnect line from a voltage signal when said voltage signal exceeds a first DC voltage level, said voltage signal having an associated DC voltage level, said isolation circuit comprising:

a transmission gate having an input terminal, an output terminal and a control terminal, said input terminal being coupled to said voltage signal and said output terminal being coupled to said interconnect line, wherein when said transmission gate is enabled, said interconnect line is coupled to said voltage signal and when it is disabled said interconnect line is decoupled from said voltage signal such that changes in voltage of said voltage signal are independent of changes in voltage on said output terminal;

a means for sensing said DC voltage level of said voltage signal, said sensing means being controlled by said voltage signal such that a disable signal is coupled to said control terminal when said voltage signal exceeds said first DC voltage level in one of a positive and negative voltage swing direction and an enable signal is coupled to said control terminal when said voltage signal does not exceed said first DC voltage level in one of a positive and negative voltage swing direction;

means for driving said interconnect line with a voltage corresponding to a second DC voltage level when said transmission gate is disabled, said driving means being enabled by said voltage signal when said voltage signal exceeds said first DC voltage level in one of a positive and negative voltage swing direction.

2. The isolation circuit as described in claim 1 wherein said sensing means is an inverter having an input and an output, said input being coupled to said voltage signal and said output being coupled to said control terminal of said transmission gate.

3. The isolation circuit as described in claim 2 wherein said driving means comprises first and second metal-oxide-silicon (MOS) devices coupled in series at a common node between a first working potential and a second working potential, said first MOS device having its gate coupled to said voltage signal, its source coupled to said first working potential and its drain coupled to said common node, said second MOS device having its gate coupled to said output of said inverter, its source coupled to said second working potential and its drain coupled to said common output node, said common node being coupled to said interconnect line.

4. The isolation circuit as described in claim 3 wherein said transmission gate is a p-channel metal-oxide-silicon field effect transistor (MOSFET).

5. The isolation circuit as described in claim 3 wherein said transmission gate is an n-channel MOSFET.

6. The isolation circuit as described in claim 1 wherein said sensing means is a comparator having a positive input, a negative input, and an output, said negative input being coupled to said voltage signal, said positive input being coupled to said first DC voltage level and said output being coupled to said control terminal of said transmission gate.

7. The isolation circuit as described in claim 1 wherein said sensing means is a comparator having a positive input, a negative input, and an output, said positive input being coupled to said voltage signal, said negative input being coupled to said first DC voltage level and said output being coupled to said control terminal of said transmission gate.

8. In a digital circuit design including a bipolar transistor that has its emitter coupled to a fixed voltage and its base coupled to a voltage signal, said voltage signal having an associated DC voltage level, a circuit for isolating said base from said voltage signal when said voltage signal transitions from to a first DC voltage level that causes the base-emitter junction of said bipolar transistor to become reverse biased, said isolation circuit comprising:

a transmission gate having an input terminal, an output terminal and a control terminal, said input terminal being coupled to said voltage signal and said output terminal being coupled to said base, said transmission gate functioning such that when it is disabled said base is decoupled from said voltage signal;

a means for sensing said DC voltage level of said voltage signal, said sensing means being controlled by said voltage signal such that a disable signal is coupled to said control terminal when said voltage signal exceeds said first DC voltage level in one of the positive and negative voltage swing direction and an enable signal is coupled to said control terminal when said voltage signal does not exceed said first DC voltage level in one of a positive and negative voltage swing direction;

means for driving said interconnect line with a voltage corresponding to a second DC voltage level when said transmission gate is disabled, said driving means being enabled by said voltage signal when said voltage signal exceeds said first DC voltage level in one of a positive and negative voltage swing direction.

9. The isolation circuit as described in claim 8 wherein said sensing means is an inverter having an input and an output, said input being coupled to said voltage signal and said output being coupled to said control terminal of said transmission gate.

10. The isolation circuit as described in claim 9 wherein said driving means comprises first and second metal-oxide-silicon (MOS) devices coupled in series at a common node between a first working potential and a second working potential, said first MOS device having its gate coupled to said voltage signal, its source coupled to said first working potential and its drain coupled to said common node, said second MOS device having its gate coupled to said output of said inverter, its source coupled to said second working potential and its drain coupled to said common node, said common node being coupled to said base.

11. The isolation circuit as described in claim 10 wherein Said transmission gate is a p-channel metal-oxide-silicon field effect transistor (MOSFET).

12. The isolation circuit as described in claim 10 wherein said transmission gate is an n-channel MOSFET.

13. The isolation circuit as described in claim 8 wherein said sensing means is a comparator having a positive input, a negative input, and an output, said negative input being coupled to said voltage signal, said positive input being coupled to said first DC voltage level and said output being coupled to said control terminal of said transmission gate.

14. A memory comprising:

at least one memory cell for storing data;

at least one bitline pair including a first bitline and a second bitline, each of said at least one bitline pair being coupled to said at least one memory cell;

at least one write driver for driving said at least one bitline pair with program voltages so as to change the logic state of said data stored in said at least one memory cell during a write operation, said program voltages having an associated DC voltage level;

at least one sense amplifier for sensing data in said at least one memory cell during a read operation, said at least one sense amplifier including first and second bipolar transistors, the base of said first transistor being coupled to said first bitline and the base of said second transistor being coupled to said second bitline, the emitters of said first and second transistors being commonly coupled to a current source;

a first transmission gate having an input terminal, an output terminal and a control terminal, coupled in series between said base of said first bipolar transistor and said first bitline, said first transmission gate functioning such that when it is enabled said first bitline is coupled to said base of said first bipolar transistor and when it is disabled said base of said first bipolar transistor is isolated from said first bitline;

a first means for sensing said associated DC voltage level of said program voltages, said first sensing means coupling a disable signal to said control terminal of said first transmission gate when said associated DC voltage level of said program voltages exceeds a first DC voltage level and said first sensing means coupling an enable signal to said control terminal of said first transmission gate when said associated DC voltage level of said program voltages does not exceed said first DC voltage level;

a first means for driving said base of said first bipolar transistor with a voltage corresponding to a second DC voltage level when said first transmission gate is disabled, said first driving means being enabled when said associated DC voltage level of said program voltages exceeds said first DC voltage level;

a second transmission gate having an input terminal, an output terminal and a control terminal, coupled in series between said base of said second bipolar transistor and said second bitline, said second transmission gate functioning such that when it is enabled said second bitline is coupled to said base of said second bipolar transistor and when it is disabled said base of said second bipolar transistor is isolated from said second bitline;

a second means for sensing said associated DC voltage level of said program voltages, said second sensing means coupling a disable signal to said control terminal of said second transmission gate when said associated DC voltage level of said program voltages exceeds said first DC voltage level and said second sensing means coupling an enable signal to said control terminal of said second transmission gate when said associated DC voltage level of said program voltages does not exceed said first DC voltage level;

a second means for driving said base of said second bipolar transistor with a voltage corresponding to said second DC voltage level when said second transmission gate is disabled, said second driving means being enabled when said associated DC voltage level of said program voltages exceeds said first DC voltage level.

15. The memory as described in claim 14 wherein said first and second sensing means are each CMOS inverters having an input and an output, said input of said each CMOS inverters being coupled to one of said at least one bitline pair and said output of said each CMOS inverters being coupled to said control terminal of one of said first and said second transmission gates.

16. The memory as described in claim 15 wherein said first and second driving means each comprise first and second metal-oxide-silicon (MOS) devices coupled in series at a common node between a first working potential and a second working potential, said first MOS device having its gate coupled to said one of said at least one bitline pair, its source coupled to said first working potential and its drain coupled to said common node, said second MOS device having its gate coupled to said output of one of said CMOS inverters, its source coupled to said second working potential and its drain coupled to said common node, said common node being coupled to one of said bases of said first and said second bipolar transistors.

17. The memory as described in claim 16 wherein said first and second transmission gates are p-channel metal-oxide-silicon field effect transistors (MOSFETs).

18. The memory as described in claim 16 wherein said first and second transmission gates are n-channel MOSFETs.

19. A memory comprising:

at least one memory cell for storing data;

a bitline being coupled to said at least one memory cell;

at least one write driver for driving said bitline with program voltages so as to change the logic state of said data stored in said at least one memory cell during a write operation, said program voltages having an associated DC voltage level;

at least one sense amplifier for sensing data in said at least one memory cell during a read operation, said at least one sense amplifier including first and second bipolar transistors, the base of said first transistor being coupled to said bitline and the base of said second transistor being coupled to a reference voltage, the emitters of said first and second transistors being commonly coupled to a current source;

a transmission gate having an input terminal, an output terminal and a control terminal, coupled in series between said base of said first bipolar transistor and said bitline, said transmission gate functioning such that when it is enabled said bitline is coupled to said base of said first bipolar transistor and when it is disabled said base of said first bipolar transistor is isolated from said bitline;

a means for sensing said associated DC voltage level of said program voltages, said sensing means coupling a disable signal to said control terminal of said transmission gate when said associated DC voltage level of said program voltages exceeds a first DC voltage level and said sensing means coupling an enable signal to said control terminal of said transmission gate when said associated DC voltage level of said program voltages does not exceed said first DC voltage level;

a means for driving said base of said first bipolar transistor with a voltage corresponding to a second DC voltage level when said transmission gate is disabled, said driving means being enabled when said associated DC voltage level of said program voltages exceeds said first DC voltage level.

20. The memory as described in claim 19 wherein said sensing means is a CMOS inverter having an input and an output, said input of said CMOS inverter being coupled to said bitline and said output of said CMOS inverter being coupled to said control terminal of said transmission gate.

21. The memory as described in claim 20 wherein said driving means comprises first and second metal-oxide-silicon (MOS) devices coupled in series at a common node between a first working potential and a second working potential, said first MOS device having its gate coupled to said bitline, its source coupled to said first working potential and its drain coupled to said common node, said second MOS device having its gate coupled to said CMOS inverter, its source coupled to said second working potential and its drain coupled to said common node, said common node being coupled to said base of said first bipolar transistor.

22. The memory as described in claim 21 wherein said transmission gate is a p-channel metal-oxide-silicon field effect transistor (MOSFET).

23. The isolation circuit as described in claim 21 wherein said transmission gate is an n-channel MOSFET.

* * * * *